(12) United States Patent
Park et al.

(10) Patent No.: US 9,202,561 B1
(45) Date of Patent: Dec. 1, 2015

(54) REFERENCE CURRENT GENERATION IN RESISTIVE MEMORY DEVICE

(71) Applicant: Integrated Silicon Solution, Inc., Milpitas, CA (US)

(72) Inventors: Geun-Young Park, Milpitas, CA (US); Seong Jun Jang, Milpitas, CA (US); Justin Kim, Seongnam (KR)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

(21) Appl. No.: 14/297,446

(22) Filed: Jun. 5, 2014

(51) Int. Cl.
*G11C 13/00* (2006.01)

(52) U.S. Cl.
CPC .......... *G11C 13/0038* (2013.01); *G11C 13/004* (2013.01)

(58) Field of Classification Search
CPC ... G11C 13/00; G11C 13/004; G11C 13/0038
USPC .......................................... 365/148, 14, 203
See application file for complete search history.

(56) References Cited

U.S. PATENT DOCUMENTS

| | | | |
|---|---|---|---|
| 7,539,050 B2 | 5/2009 | Philipp et al. | |
| 8,045,361 B2 | 10/2011 | Lee et al. | |
| 8,351,245 B2 | 1/2013 | Ma et al. | |
| 8,559,253 B2 | 10/2013 | Kitagawa et al. | |
| 2008/0001667 A1* | 1/2008 | Yang et al. | 330/260 |
| 2009/0086534 A1* | 4/2009 | DeBrosse et al. | 365/163 |
| 2010/0195422 A1* | 8/2010 | Imai | 365/194 |
| 2012/0314478 A1 | 12/2012 | Ha et al. | |
| 2013/0235648 A1 | 9/2013 | Kim et al. | |
| 2013/0279243 A1 | 10/2013 | Huang | |
| 2014/0092670 A1 | 4/2014 | Cosemans | |
| 2014/0098592 A1 | 4/2014 | Lee | |
| 2014/0104933 A1* | 4/2014 | Yamahira | 365/148 |
| 2014/0254241 A1* | 9/2014 | Shiimoto | 365/148 |

* cited by examiner

*Primary Examiner* — Hoai V Ho
*Assistant Examiner* — Muna A Techane
(74) *Attorney, Agent, or Firm* — Van Pelt, Yi & James LLP

(57) ABSTRACT

A resistive memory device incorporates a reference current generation circuit to generate a reference current for the sense amplifier that is immune to variation in the resistance of the reference resistive memory cells. In some embodiments, the reference current generation circuit uses reference resistive memory cells configured in the low resistance state only. The reference current generation circuit generates the reference current by combining a reference cell current and a bias current. The bias current is regulated by a feedback circuit in response to changes in the reference current to maintain the reference current at a substantially constant value and having a current value being an average of the cell currents for a resistive memory cell in the high resistance state and the low resistance state.

15 Claims, 6 Drawing Sheets

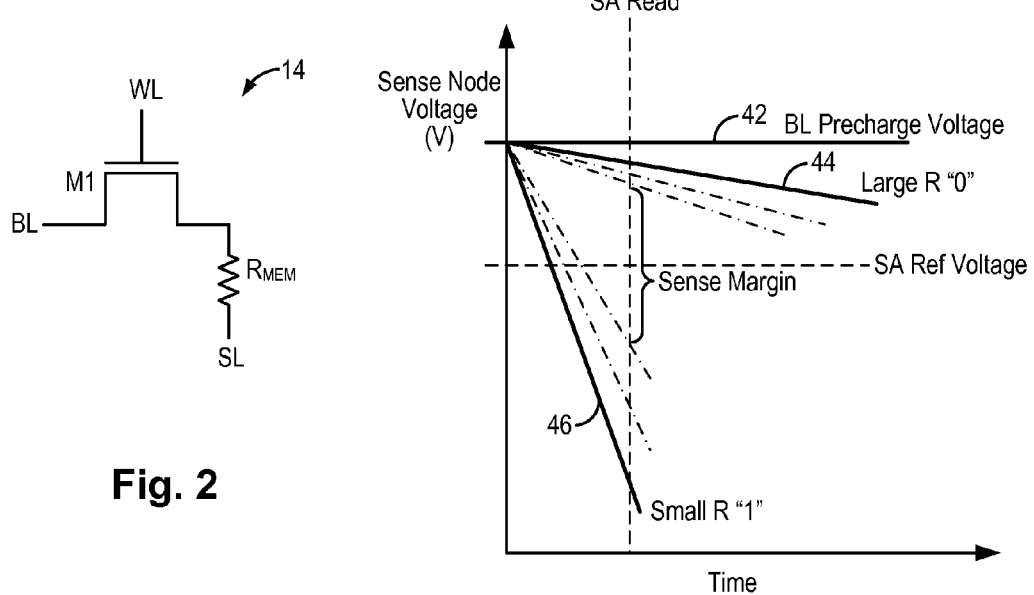
Fig. 2
Fig. 3
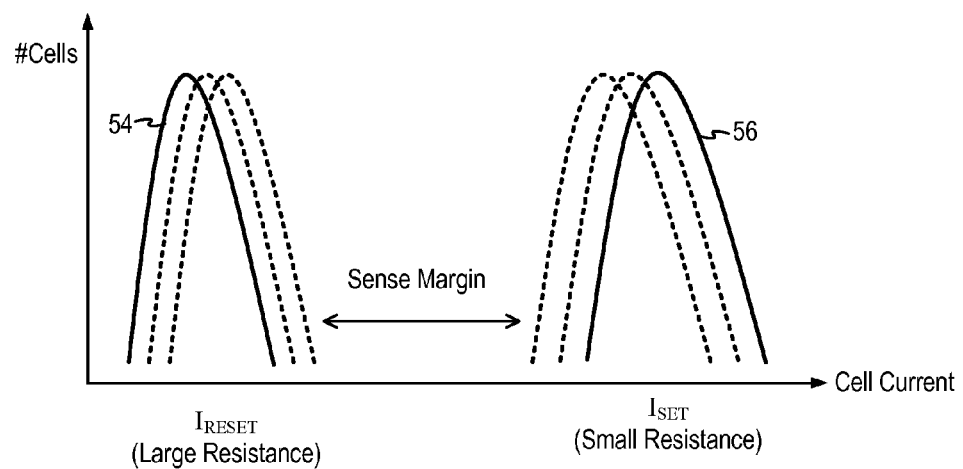
Fig. 4

REFERENCE CURRENT GENERATION IN RESISTIVE MEMORY DEVICE

BACKGROUND OF THE INVENTION

Resistive random-access memory (RRAM or "resistive memory") is a type of non-volatile memory where the data storage function is implemented in a variable resistance element whose resistance value can change between a low level and a high level. For example, most resistive memory devices include as the variable resistance element a controllable resistor material between upper and lower conductive electrodes. The controllable resistor material may be a transition metal oxide or other suitable materials. A conductive path is created or dissolved in the controllable resistor material, corresponding to low-resistive and high-resistive states. A resistive memory cell in a resistive memory device typically includes a variable-resistance resistive memory element connected serially with a switching device acting as a cell selector. The switching device is typically an NMOS transistor.

In some examples, a resistive memory cell can store a logical "0" value by programming the resistive memory element to have a relatively large resistance ($R_{RESET}$). The resistive memory cell can store a logical "1" value by programming the resistive memory element to have a relatively small resistance ($R_{SET}$). However, due to limitations in the fabrication process, the resistance values for the high and low resistance levels are often distributed over a range. Furthermore, the resistance values for the high and low resistance levels often vary over time.

Resistive memory devices have advantages over existing memory devices, such as DRAM, for their low operating current, fast access time, and long data retention. Furthermore, resistive memory devices are attractive as replacement for existing memory devices because of their compatibility with existing CMOS fabrication technologies.

BRIEF DESCRIPTION OF THE DRAWINGS

Various embodiments of the invention are disclosed in the following detailed description and the accompanying drawings.

FIG. 2 is a schematic diagram of a resistive memory cell in the resistive memory device in some examples of the present invention.

FIG. 3 is a plot of the sense node voltage of a resistive memory during the read operation in some example.

FIG. 4 is a plot of the cell current distribution for high and low resistance states in a resistive memory device in some example.

FIGS. 6(a) to 6(c), is a plot of the cell current distribution for high and low resistance states in a conventional resistive memory device in some example.

FIGS. 8(a) to 8(c), is a plot of the cell current distribution for high and low resistance states in a resistive memory device and illustrates the operation of the reference current generation circuit in embodiments of the present invention.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a resistive memory device incorporates a reference current generation circuit to generate a reference current for the sense amplifier that is immune to variation in the resistance of the reference resistive memory cells. In some embodiments, the reference current generation circuit uses a reference resistive memory cell configured in the low resistance state and includes a feedback circuit to detect for variations in the reference cell current provided by the reference resistive memory cells. The reference current generation circuit compensates for changes in the reference cell current due to variations in the resistance of the reference resistive memory cell. In this manner, the reference current provided to the sense amplifier for read operations is maintained at a substantially fixed value over variations of the reference cell resistance. Furthermore, the reference current is maintained at a desirable mid-point for equal sense margin for high and low logical states.

Figure 1:
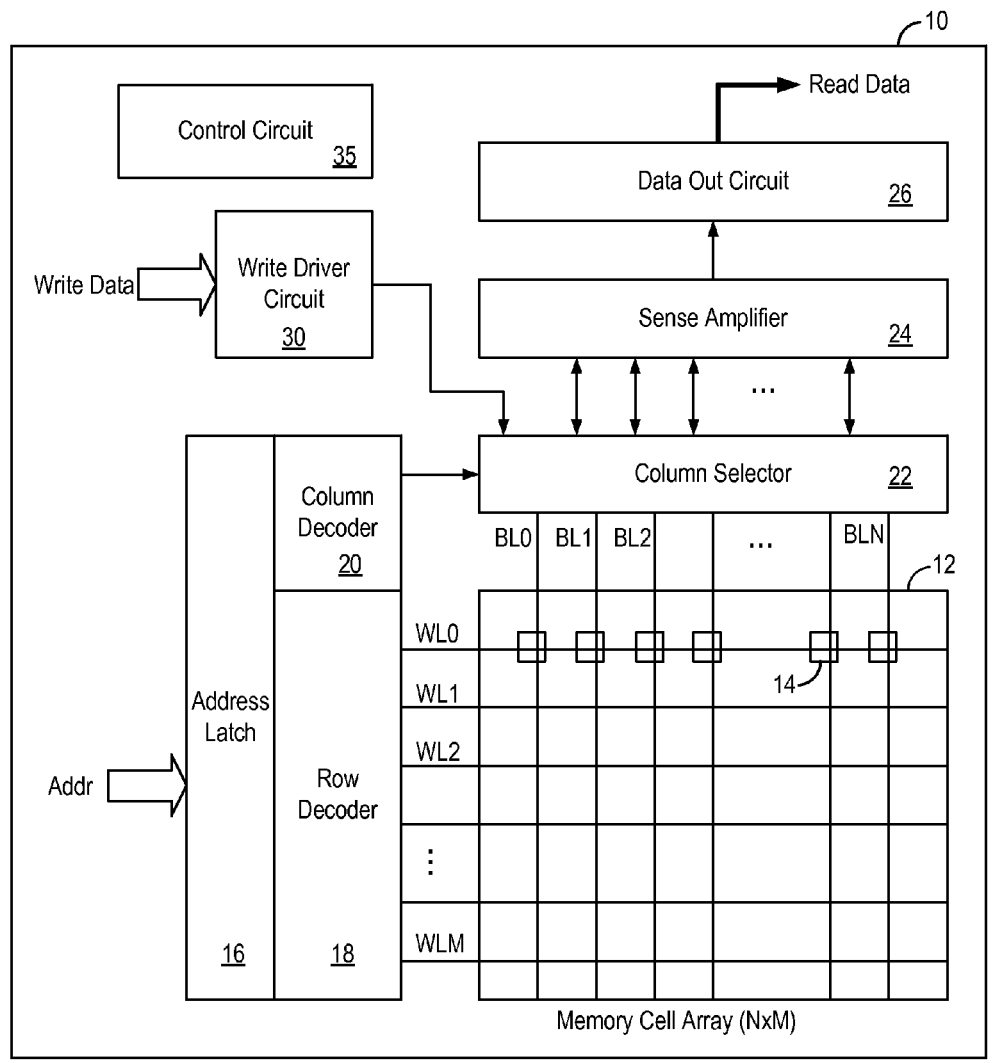
FIG. 1 is a block diagram of a resistive memory device in one exemplary embodiment.

FIG. 1 is a block diagram of a resistive memory device in one exemplary embodiment. FIG. 1 is illustrative only and the resistive memory device may include additional components not shown in FIG. 1. Referring to FIG. 1, the resistive memory device 10 includes a two-dimensional array 12 of resistive memory cells 14. The cell array 12 is addressed by a row decoder 18 and a column decoder 20 to selectively access the resistive memory cells 14 for read and write operations. In some cases, a refresh operation may be performed to preserve the stored data. In particular, an address Addr is received at an address latch 16 and the received address is decoded by the row decoder 18 which selects the word lines and the column decoder 20 which selects the bit lines of the memory array 12. The resistor memory cells 14 in the array 12 are accessed by word lines WL0 to WLM and bit lines BL0 and BLN. In conventional operation, the row decoder 18 selectively activates a word line from WL0 to WLM. The column decoder selectively activates a bit line from BL0 to BLN through the column selector circuit 22 to allow a resistive memory cell 14 at the intersection of the selected word line and selected bit line to be accessed.

To read data from the memory array 12, the column selector circuit 22 connects the bit lines to a sense amplifier circuit 24. The sense amplifier output is connected to a data out circuit 26 to provide read data as the output data of the resistive memory device 10. To write data to the memory array 12, the column selector circuit 22 connects the bit lines to a write driver circuit 30 which is configured to receive write data. In practice, the write driver circuit 30 and the sense amplifier circuit 24 includes a bank of write drivers and a bank of sense amplifiers, one set of write driver and one set of sense amplifier for each input/output (I/O) of the flash memory device. Each set of write driver and sense amplifier is coupled to a block of memory cells 14 in the cell array 12. For example, when the resistive memory device 10 generates output data in K-bit (i.e. K-bit I/O), the write driver circuit 30 and the sense amplifier circuit 24 may include K write drivers and K sense amplifiers, each write driver circuit and each sense amplifier circuit being coupled to a block of bits lines associated with a databit of the output data. A control circuit 35 controls the operation and the mode configuration of the resistive memory device 10. The memory architecture shown in FIG. 1 is illustrative only and it will be appreciated that the structure and methods described herein may be utilized in other memory architectures.

In the present embodiment, resistive memory cells 14 are implemented using a metal-controllable-resistor-metal structure where the controllable resistor material as the resistive memory element is formed between upper and lower conductive electrodes. The controllable resistor material has variable resistance and can be programmed to a high resistance state or a low resistance state. FIG. 2 is a schematic diagram of a resistive memory cell in the resistive memory device in some examples of the present invention. Referring to FIG. 2, a resistive memory cell 14 includes a resistive memory element denoted as a resistor $R_{MEM}$ connected in series with a switching device M1 acting as a cell selector. In the present example, the switching device M1 is an NMOS transistor. The drain terminal of the cell selector transistor M1 is coupled to the bit line BL, the gate terminal of the cell selector transistor M1 is coupled to the word line WL. The resistive memory element $R_{MEM}$ is connected in series with the source terminal of the cell selector transistor M1. The other end of the resistive memory element $R_{MEM}$ is the source line SL of the cell array 12. In operation, the source line SL of the cell array may be connected to different voltage potential to facilitate the writing, reading and refreshing of the memory content. In some embodiments, the resistive memory element $R_{MEM}$ is formed using carbon nanotubes.

In some embodiments, the resistive memory cell may be configured to store a logical low value (logical "0") by programming the resistive memory element to have a relatively large resistance ($R_{RESET}$). In the present description, the logical low or "0" state of the resistive memory cell may be referred to as a "reset" state. The resistive memory cell may also be configured to store a logical high value (logical "1") by programming the resistive memory element to have a relatively small resistance ($R_{SET}$). In the present description, the logical high or "1" state of the resistive memory cell may be referred to as a "set" state. Thus, the resistive memory element $R_{MEM}$ may have a large resistance value in the reset state and a small resistance value in the set state. It is understood that resistive memory cells may be constructed to operate in the opposite resistance states in other configurations of the resistive memory device. That is, the resistive memory element $R_{MEM}$ may have a small resistance value in the reset state and a large resistance value in the set state in other embodiments.

In general, a resistive memory cell is said to be in a high resistance state when the memory cell has a large resistance value and a resistive memory cell is said to be in a low resistance state when the memory cell has a small resistance value. The high and low resistance states can be assigned to either of the logical low or logical high states.

To write data to a resistive memory cell, a word line is activated by the row address and a bit line is selected by the column selector in response to a column address. The write driver circuit 30 receives the input write data and generate a write pulse in response to the write data. The write pulse is coupled to the bit line BL of the memory cell. Meanwhile, the source line SL of the resistive memory cell is biased to a selected level in response to the write data. The resistive memory element of the selected resistive memory cell is then programmed to a specific resistance value in response to the write data. In particular, to write a logical low value (reset) to the resistive memory cell, a write pulse having a logical low value (e.g. ground) is provided to the bit line BL while the source line SL is biased to a positive voltage value. The resistive memory element is programmed to a high resistance state. On the other hand, to write a logical high value (set) to the resistive memory cell, a write pulse having a logical high value (e.g. the positive power supply voltage) is provided to the bit line BL while the source line SL is biased to the ground potential or a negative voltage value. The resistive memory element is programmed to a low resistance state.

To read data stored from a resistive memory cell, the programmed resistance value of a resistive memory cell can be determined by comparing the programmed resistance to a reference resistance. In practice, the resistance value of the resistive memory cell may be detected by measuring a cell current that flows through the resistive memory element when the cell selector transistor M1 is turned on. The cell current value is directly related to the programmed resistance value of the memory cell. More specifically, the cell current value is inversely proportional to the programmed resistance value of the memory cell. Accordingly, when the memory cell is programmed to a large resistance value (the reset state), the cell current is small. Meanwhile, when the memory cell is programmed to a small resistance value (the set state), the cell current is large. Thus, the programmed resistance value of a resistive memory cell can be determined by comparing the cell current to a reference current. In some embodiments, the cell current is used to develop a voltage at a sense node. The sense node voltage, being indicative of the cell current, is measured and compared to a reference voltage to determine the programmed resistance of the resistive memory cell.

In one example, the read operation for a resistive memory cell will be described with reference to FIGS. 3 and 4. FIG. 3 is a plot of the sense node voltage of a resistive memory during the read operation in some example. FIG. 4 is a plot of the cell current distribution for high and low resistance states in a resistive memory device in some example. When a resistive memory cell is selected for read out, a bit line associated with the selected memory cell is selected by the column selector in response to the column address. The selected bit line is precharged to a precharge voltage level (curve 42). Meanwhile, the source line SL of the resistive memory cell is connected to the ground potential. Then, the word line is activated by the row address associated with the selected memory cell. The word line is activated to turn on the cell selector transistor M1. With the bit line (sense node) precharged to the precharge voltage level and the source line connected to the ground potential, a cell current flows through the resistive memory element $R_{MEM}$ where the cell current has a current value indicative of the programmed resistance of the resistive memory cell.

In some cases, the resistive memory device is implemented using a voltage sense amplifier. In that case, the bit line is connected to a sense node where the voltage on the bit line or at the sense node is sensed or measured. As a result of the cell current flowing through the resistive memory element $R_{MEM}$, the sense node voltage is discharged from the precharged voltage level (curve 42). In particular, the sense node voltage decreases at a rate indicative of the programmed resistance of the resistive memory cell. When the resistive memory cell is in the reset state with a large resistance value (curve 44), the cell current is small and the sense node voltage decreases slowly from the precharged voltage level. When the resistive memory cell is in the set state with a small resistance value (curve 46), the cell current is large and the sense node voltage decreases quickly from the precharged voltage level. The sense node voltage is allowed to develop for a given time duration and then the sense node voltage is read by a voltage sense amplifier and compared with a reference voltage (SA Ref Voltage). When the sense node voltage is greater than the sense amplifier reference voltage, the resistive memory cell is in the reset state ("0"). When the sense node voltage is less than the sense amplifier reference voltage, the resistive memory cell is in the set state ("1"). The read out data is thus derived from the sense amplifier output comparing the sense node voltage to the reference voltage.

In other examples, the resistive memory device is implemented using a current sense amplifier. In that case, the cell current from the selected memory cell is compared with a reference current to determine the programmed resistance of the memory cell. The reference current may be generated using a set of reference resistive memory cells. The reference current has a value that is between the cell currents associated with the high resistance state ($I_{RESET}$) and low resistance state ($I_{SET}$). The programmed resistance of the selected resistive memory cell can be discerned by comparing the cell current to the reference current. For example, when the cell current is greater than the reference current, the resistive memory cell is in the set state ("1") and when the cell current is less than the reference current, the resistive memory cell is in the reset state ("0").

Due to properties of the controllable resistor material being used as the resistive memory element and limitations in the fabrication process, the resistance values for the high and low resistance states are often distributed over a range and the resistance values may vary over time. Furthermore, repeated reading of the resistive memory cell may also cause the resistance values to drift. For example, when the resistive memory device is fabricated using scaled down feature size, it is increasingly difficult to fabricate resistive memory cells with uniform contact size. Thus, it is difficult to achieve a uniform write current across all the memory cells, which results in variations in the electrical characteristics of the memory cells, such as variation in the resistance values of the resistive memory element. The process variations and limitations leads to narrowing of the read sense margin of the memory cells. Narrowing of the read sense margin degrades performance and yield of the resistive memory device.

In order to read out the programmed resistance value from the memory cell accurately, a sufficiently large sense margin is needed to ensure detection of the logical high state and the logical low state. In the present description, the sense margin is defined as the distance between the high resistance value (the reset state) and the low resistance value (the set state) of the resistive memory cell, which can be represented by the distance between the cell current values or the sense node voltage values for the reset state and the set state. Referring to FIG. 4, in the ideal case, the cell current for the reset state (reset current $I_{RESET}$) will have distribution centered around the desired reset current value as denoted by curve 54 while the cell current for the set state (set current $I_{SET}$) will have a distribution centered around the desired set current value as denoted by curve 56. The ideal reset cell current and the ideal set cell current have a sufficiently large current difference value to provide a sufficiently large sense margin between the set state and the reset state. However, due to fabrication process variations, limitations of the controllable resistor material, or repeated read operations, the reset and set programmed resistance values tend to drift from the ideal values over time. This is particularly problematic as the set and reset resistance values, or set and reset cell current values, tend to converge, reducing the sense margin which reduces the read data accuracy. Referring to FIG. 3, when the reset and set programmed resistance values converges, the sense node voltage values between the set state and the reset state also converge, reducing the available sense margin and reducing the read data accuracy.

In embodiments of the present invention, the resistive memory device is implemented using a current sense amplifier for the read operations. That is, the sense amplifier compares the cell current from a selected resistive memory cell to a reference current. The reference current is typically generated using a set of reference resistive memory cells.

Figure 5:
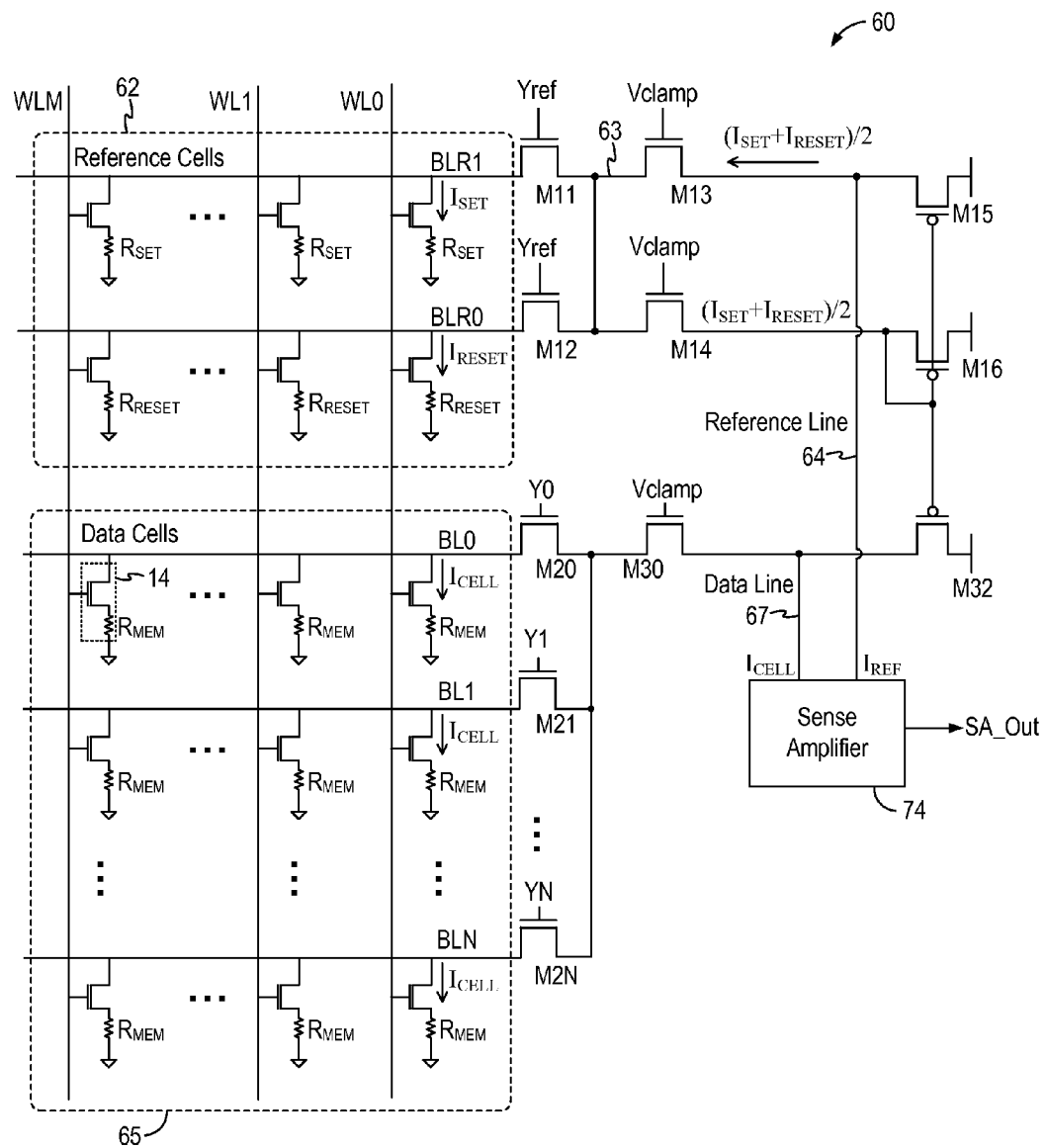
FIG. 5 is a schematic diagram of a conventional resistive memory device illustrating a conventional method for generating a reference current using reference memory cells.

FIG. 5 is a schematic diagram of a conventional resistive memory device illustrating a conventional method for generating a reference current using reference memory cells. Referring to FIG. 5, the conventional resistive memory device 60 includes a set of reference resistive memory cells 62 (Reference Cells) forming two reference cell bit lines BLR0 and BLR1. The set of reference cells 62 include a pair of reference cells coupled to each word line WL0 to WLM of the memory array. The reference cells coupled to the reference cell bit line BLR1 are programmed to the low resistance state $R_{SET}$ while the reference cells coupled to the reference cell bit line BLR0 are programmed to a high resistance state $R_{RESET}$. For example, the reference cells coupled to the reference cell bit line BLR1 can be programmed to store a logical "1" value while the reference cells coupled to the reference cell bit line BLR0 can be programmed to store a logical "0".

As thus configured, when a word line is activated during the read operation, a pair of reference resistive memory cells are enabled to generate a reference current for the sense amplifier 74 where each pair of reference resistive memory cells include one reference cell having the high resistance state and one reference cell having the low resistance state. In particular, each pair of reference memory cells coupled to the same word line are arranged to be connected in parallel when a read operation is initiated to generate a reference current that is ideally half of the cell current for the low resistance state and the cell current for the high resistance state. That is, $I_{REF}=(I_{SET}+I_{RESET})/2$. In particular, the reference cell bit lines BLR0 and BLR1 are shorted at a node 63 so that when the column selector transistors M11 and M12 are activated during the read operation, the cell current from the high resistance reference cell and the cell current of the low resistance reference cells are averaged to generate the reference current $I_{REF}$ on a reference line 64.

During the read operation, the reference current $I_{REF}$ is provided on the reference line 64 to the sense amplifier 74. Meanwhile, the selected word line WLx is activated and one of the column selector transistors M20 to M2N is activated to select a data cell for read out. The cell current $I_{CELL}$ from the selected data cell is provided on a data line 67 to the sense amplifier 74. NMOS transistors M13, M14 and M30 are controlled by the Vclamp signal to clamp the selected bit line and the reference cell bit lines to a desired voltage. PMOS transistors M15, M16 and M32 form the current mirror load circuit of the sense amplifier 74. Accordingly, the currents $I_{CELL}$ and $I_{REF}$ are translated into a differential voltage at the input terminals of the sense amplifier 74 by the current mirror load circuit. The differential voltage is sensed by the sense amplifier to generate an output signal SA_Out indicative of the difference between the current $I_{CELL}$ and the reference current $I_{REF}$.

The read operation in the conventional resistive memory device is essentially the comparison between the cell current of the selected resistive memory cell and the reference current. A sufficient sense margin is required to ensure accurate and reliable data read out. However, because the resistance of the resistive memory cells is distributed over a range, variations in the resistance of the reference memory cells result in variations in the reference current thus generated. As a result, the sense margin for at least one of the logical values is significantly reduced.

Figure 6:
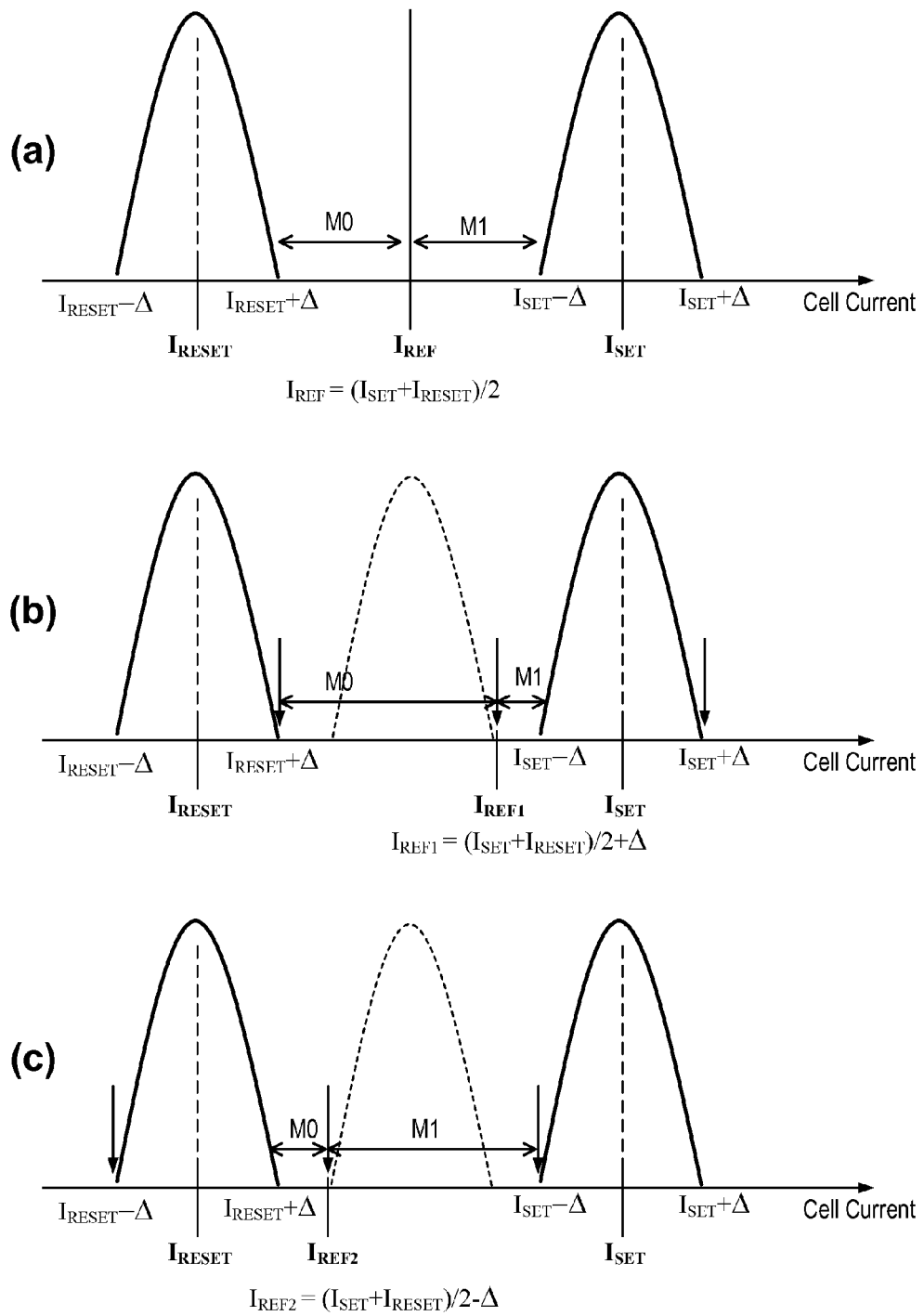
FIG. 6, which includes

FIG. 6, which includes FIGS. 6(*a*) to 6(*c*), is a plot of the cell current distribution for high and low resistance states in a conventional resistive memory device in some example. Referring to FIG. 6(*a*), in a resistive memory device, the cell current $I_{SET}$ for the set state and the cell current $I_{RESET}$ for the reset state both have a distribution about their ideal or mean value. That is, in any typical resistive memory device, the cell current of the resistive memory cells will have values ranging from $I_{SET}\pm\Delta$ for the set state and from $I_{RESET}\pm\Delta$ for the reset state, as shown in FIG. 6(*a*). In the ideal case, the reference cells have the ideal high and low resistance values and the reference current $I_{REF}$ is the ideal average of the cell current $I_{SET}$ for the set state and the cell current $I_{RESET}$ for the reset state. Thus, the reference current is $I_{REF}=(I_{SET}+I_{RESET})/2$, which is the mid-point between the set current distribution and the reset current distribution. In the ideal case, the sense margin M0 for sensing a logical low value and the sense margin M1 for sensing a logical high value is equal.

However, in the event that the reference current cell has the minimum resistance value of the distribution, the reference current $I_{REF1}$ will be shifted up towards the set current distribution, as shown in FIG. 6(*b*). Alternately, in the event that the reference current cell has the maximum resistance value of the distribution, the reference current $I_{REF1}$ will be shifted down towards the reset current distribution, as shown in FIG. 6(*c*). In either case, when the reference current drifts due to variation in the reference cell resistance, the sense margin for either the logical low value (M0) or the logical high value (M1) will be reduced significantly. The sense margin becomes uneven and the accuracy of the data read out is negatively impacted.

In embodiments of the present invention, a resistive memory device incorporates a reference current generation circuit to generate a reference current for the sense amplifier that is immune to variation in the resistance of the reference resistive memory cells. The reference current generation circuit includes a feedback circuit to adjust the reference current so as to compensate for the reduced sensing margin caused by the resistance distribution of the reference cells.

Figure 7:
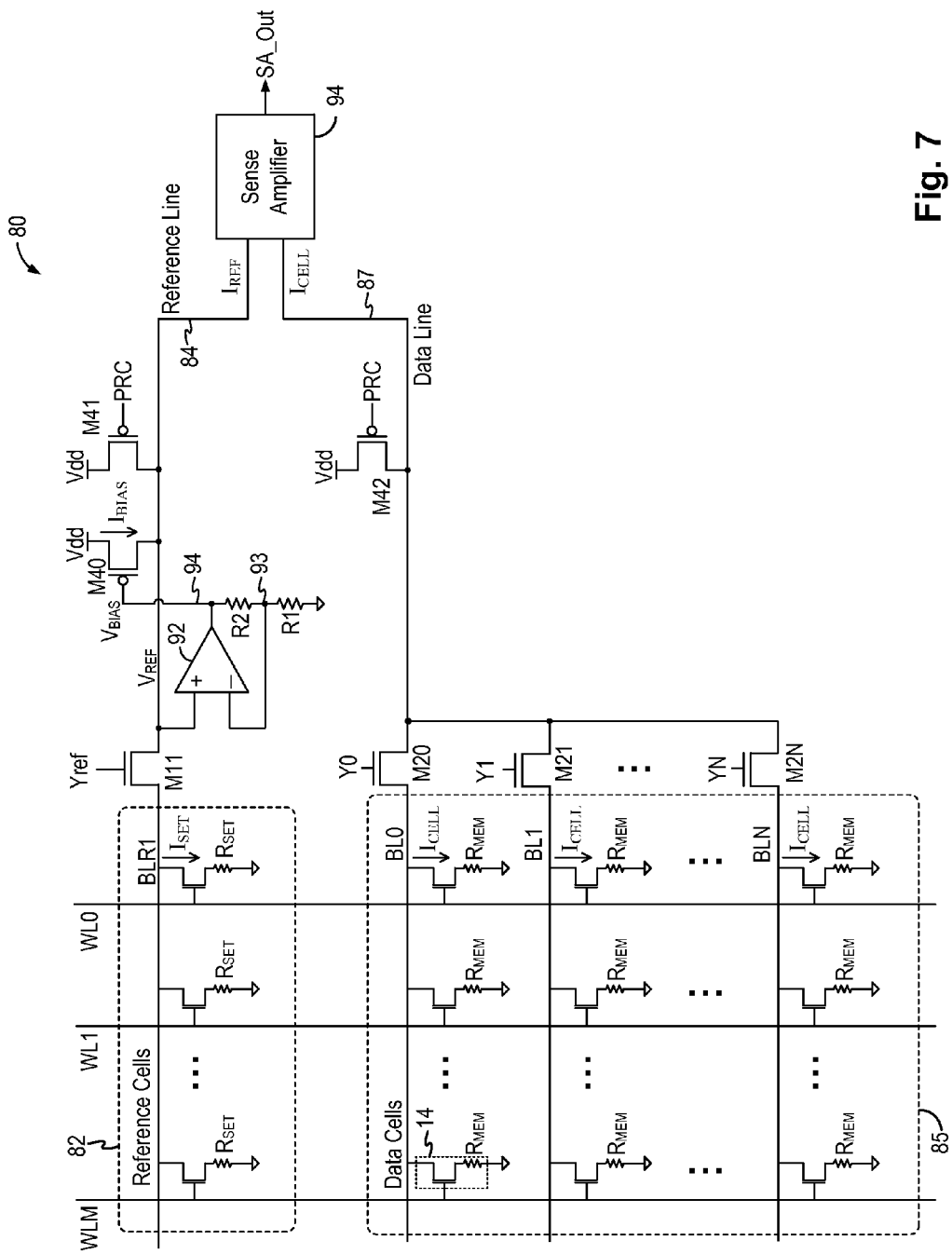
FIG. 7 is a schematic diagram of a resistive memory device incorporating the reference current generation circuit in embodiments of the present invention.

FIG. 7 is a schematic diagram of a resistive memory device incorporating the reference current generation circuit in embodiments of the present invention. FIG. 7 illustrates only portions of the resistive memory device related to the read operation. Other portions of the resistive memory device are omitted to simplify the discussion. Referring to FIG. 7, the resistive memory device 80 includes an array 85 of resistive memory cells 14 for storing memory data. The resistive memory cells 14 in the array 85 will also be referred to as data cells 85 in the following description. Each data cell 85 is connected to a respective word lines WL0 to WLM, activated by a row address, and a respective bit line BL0 to BLN, activated by a column address. More specifically, column selector transistors M20 to M2N are coupled to each of the bit lines BL0 to BLN and controlled by a column select signal Y0 to YN. One of the column select signal Yx and one of the word line WLx are activated to select one data cell 85 for read operation. When the column selector transistor Yx is activated, a cell current $I_{CELL}$ flows in the data line 87 indicative of the resistance of the selected data cell 85. Prior to initiation of the read operation, the data line 87 is precharged to a positive power supply voltage Vdd by a precharge transistor M42 under the control of a precharge control signal PRC.

The cell current $I_{CELL}$ carried in the data line 87 is provided to a sense amplifier 94 to be compared with a reference current $I_{REF}$. In the present embodiment, sense amplifier 94 is a current sense amplifier and detects the current difference between the cell current $I_{CELL}$ and the reference current $I_{REF}$ to determine the programmed resistance of the selected data cell 85. To provide a stable and reliable reference current, the resistive memory device 80 uses a reference current generation circuit including a set of reference resistive memory cells 82 (Reference Cells), a bias current source and a feedback circuit. A salient feature of the reference current generation circuit of the present invention is that only reference resistive memory cells programmed to the low resistance state $R_{SET}$ are used. Accordingly, the reference cells form only a single reference cell bit line BLR1. The set of reference cells 82 include a reference cell coupled to each word line WL0 to WLM of the memory array. For example, the reference cells coupled to the reference cell bit line BLR1 can be programmed to store a logical "1" value. Using only memory cells programmed to the low resistance state provides a close approximation to the average current of the high/low resistance states as the cell current for the high resistance state ($I_{RESET}$) is small in comparison to the cell current for the low resistance state ($I_{SET}$) and contributes only a fraction of the average current for the high/low resistance states.

The reference cells 82 are connected by a column selector transistor M11 to the reference line 84 which carries the reference current $I_{REF}$. Column selector transistor M11 is controlled by the column select signal Yref which is asserted to turn on the column selector transistor M11 during the read operation. Prior to initiation of the read operation, the reference line 84 is precharged to a positive power supply voltage Vdd by a precharge transistor M41 under the control of the precharge control signal PRC.

When a reference cell 82 is selected by the respective word line WLx and the column select signal Yref, the cell current $I_{SET}$ associated with the low resistance state (the "set current $I_{SET}$") flows through the selected reference cell. In particular, the cell current $I_{SET}$ flows from the precharged the reference line 84 through the resistive memory element $R_{SET}$ to the source line which is coupled to the ground potential. The reference current generation circuit includes a bias current source which supplies a bias current to the reference line 84. The bias current and the set current from the reference cell are combined to generate the reference current $I_{REF}$. In the present example, the reference current $I_{REF}$ at the reference line 84 is the difference of the set current $I_{SET}$ and the bias current $I_{BIAS}$. That is, $I_{REF}=I_{SET}-I_{BIAS}$. The bias current source is controlled in a manner so that the reference current $I_{REF}$ is between the cell current $I_{RESET}$ for the low resistance state and the cell current $I_{SET}$ for the high resistance state, that is, $I_{RESET}<I_{REF}<I_{SET}$. In some embodiments, the bias current source is controlled so that the reference current $I_{REF}$ is set to be equal to the average current value of the set current $I_{SET}$ and the reset current $I_{RESET}$, that is $I_{REF}=(I_{RESET}+I_{SET})/2$. In most cases, the reset current $I_{RESET}$ is small and thus the reference current $I_{REF}$ can be approximated to be about half the set current value $I_{SET}/2$. The bias current $I_{BIAS}$ is therefore about half of the set current value $I_{SET}$.

In the present embodiment, the bias current source is implemented using a PMOS transistor M40. The PMOS current source M40 is controlled by a bias control voltage $V_{BIAS}$ generated by the feedback circuit. The feedback circuit generates the bias control voltage $V_{BIAS}$ to control the PMOS current source M40 so that $I_{REF}=I_{SET}-I_{BIAS}=(I_{RESET}+I_{SET})/2$. More specifically, the feedback circuit includes an operational amplifier (opamp) 92 configured in a unity gain feedback loop. In other words, opamp 92 operates as a unity gain buffer. The opamp 92 has a positive input terminal configured to measure a voltage level of the reference line 84 (reference voltage $V_{REF}$). The output node 94 of the opamp 92 is connected back to the negative input terminal through a resistive divider consisting of resistors R1 and R2. The opamp 92 measures the reference voltage $V_{REF}$ and generates the bias control voltage $V_{BIAS}$ at the output node 94 that compensates for the variation in the reference voltage $V_{REF}$. In particular, the cell current $I_{SET}$ of the selected reference cell may vary due to variations in the resistance value of the reference cell. When the current $I_{SET}$ varies, the reference current $I_{REF}$ and the reference voltage $V_{REF}$ at the reference line 84 also vary. The opamp 92 generates the bias control voltage $V_{BIAS}$ to compensate for changes in the reference current $I_{REF}$ by controlling the bias current source to generate a bias current $I_{BIAS}$ that counteracts the reference current variations. The reference current $I_{REF}$ is thus made to be as close as possible to a fixed value and to a middle point between the low and high resistance state, despite variation of reference cell resistances.

Figure 8:
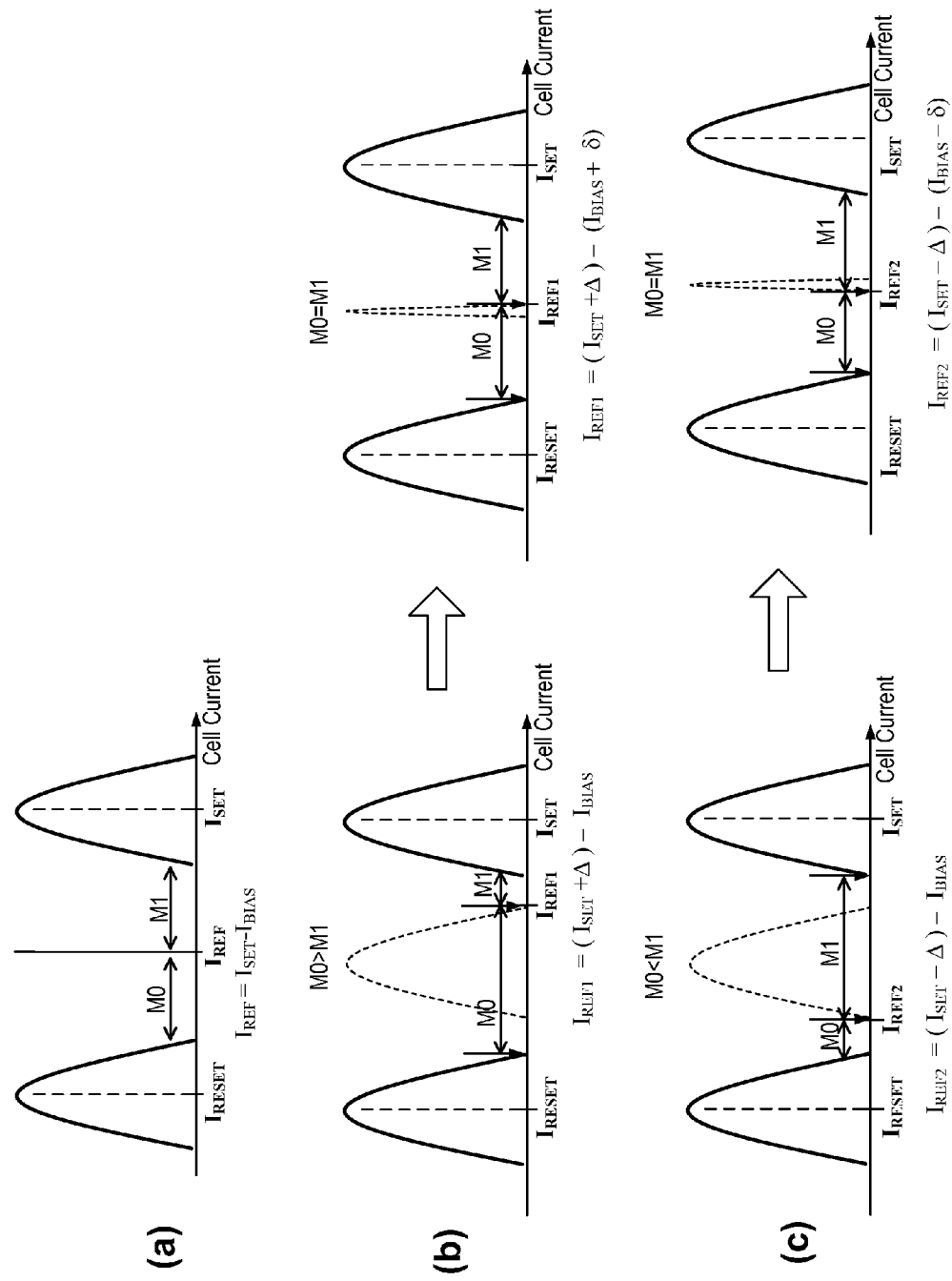
FIG. 8, which includes

In other words, the feedback circuit of opamp 92 adjust the bias current $I_{BIAS}$ so that the reference current $I_{REF}$ is fixed and also provides equal margin for logical high and logical low states. FIG. 8, which includes FIGS. 8(a) to 8(c), is a plot of the cell current distribution for high and low resistance states in a resistive memory device and illustrates the operation of the reference current generation circuit in embodiments of the present invention. Referring first to FIG. 8(a), in a resistive memory device, the cell current $I_{SET}$ for the set state and the cell current $I_{RESET}$ for the reset state both have a distribution about their ideal or mean value. The cell current of the resistive memory cells will have values ranging from $I_{SET}\pm\Delta$ for the set state and from $I_{RESET}\pm\Delta$ for the reset state, as shown in FIG. 8(a). In the ideal case, the reference cell has the ideal low resistance value and the cell current $I_{SET}$ of the reference cell has the ideal set current value. In that case, the reference current $I_{REF}$ is set by the bias current $I_{BIAS}$ generated by PMOS current source M40 to have a value that is the midpoint between the set current $I_{SET}$ and the reset current $I_{RESET}$. Equal sense margin for logical low values (M0) and logical high values (M1) is realized. In particular, $$I_{REF}=I_{SET}-I_{BIAS}=(I_{RESET}+I_{SET})/2.$$

However, in actual practice, the reference cell resistance is distributed over a range of values. Referring first to FIG. 8(b), in the case that the reference cell has a smaller resistance than mean value of the distribution, the cell current $I_{SET}$ of the reference cell becomes larger than mean value by A. In that case, the reference current $I_{REF1}$ will be shifted to larger current value as shown in FIG. 8(b). The sense margin for logical high values (M1) becomes significantly reduced. In particular, the shifted reference current $I_{REF1}$ becomes:

$$I_{REF1}=(I_{SET}+\Delta)-I_{BIAS}.$$

Referring first to FIG. 8(c), in the case that the reference cell has a smaller resistance than mean value of the distribution, the cell current $I_{SET}$ of the reference cell becomes smaller than mean value by $\Delta$. In that case, the reference current $I_{REF2}$ is shifted to smaller current value as shown in FIG. 8(c). The sense margin for logical low values (M0) becomes significantly reduced. In particular, the shifted reference current $I_{REF2}$ becomes:

$$I_{REF2}=(I_{SET}-\Delta)-I_{BIAS}.$$

The feedback circuit in the reference current generation circuit operates in the following manners to compensate for the variations in the reference cell resistance, which results in variations in the reference current.

First, in the case where the reference cell has a smaller resistance than the ideal or target value and the cell current $I_{SET}$ of the reference cell becomes larger ($I_{SET}+\Delta$) (FIG. 8(b)), the reference voltage $V_{REF}$ on the reference line 84 becomes smaller. The decrease in the reference voltage $V_{REF}$ causes opamp 92 to generate a bias control voltage $V_{BIAS}$ that opposes the reference voltage changes by a factor of (R1+R2)/R1. The bias control voltage $V_{BIAS}$ thus increases so that the PMOS current source M40 increases the bias current $I_{BIAS}$ being generated by a δ amount (i.e., $I_{BIAS}+\delta$). The increase δ in the bias current $I_{BIAS}$ compensates the increase A in the reference cell current $I_{SET}$ so that the reference current $I_{REF}$ becomes constant and remains at the mid-point between the set current $I_{SET}$ and the reset current $I_{RESET}$, as shown in FIG. 8(b). More specifically:

$$I_{REF1}=(I_{SET}+\Delta)-(I_{BIAS}+\delta);$$

$$I_{REF1}=I_{SET}-I_{BIAS}=(I_{RESET}+I_{SET})/2, \text{ when } \Delta\approx\delta.$$

In other words, when the reference cell resistance becomes too low and the reference current becomes too large, the feedback circuit draw more $I_{BIAS}$ current to compensate.

Second, in the case where the reference cell has a larger resistance than the ideal or target value and the cell current $I_{SET}$ of the reference cell becomes smaller ($I_{SET}-\Delta$) (FIG. 8(c)), the reference voltage $V_{REF}$ on the reference line 84 becomes larger. The increase in the reference voltage $V_{REF}$ causes opamp 92 to generate a bias control voltage $V_{BIAS}$ that opposes the reference voltage changes by a factor of (R1+R2)/R1. The bias control voltage $V_{BIAS}$ decreases so that the PMOS current source M40 decreases the bias current $I_{BIAS}$ being generated by a δ amount (i.e., $I_{BIAS}-\delta$). The decrease δ in the bias current $I_{BIAS}$ compensates the decrease A in the reference cell current $I_{SET}$ so that the reference current $I_{REF}$ becomes constant and remains at the mid-point between the set current $I_{SET}$ and the reset current $I_{RESET}$, as shown in FIG. 8(c). More specifically:

$$I_{REF2}=(I_{SET}-\Delta)-(I_{BIAS}-\delta);$$

$$I_{REF2}=I_{SET}-I_{BIAS}=(I_{RESET}+I_{SET})/2, \text{ when } \Delta\approx\delta.$$

In other words, when the reference cell resistance becomes too high and the reference current becomes too small, the feedback circuit draws less $I_{BIAS}$ current to compensate.

In this manner, the reference current generation circuit of the present invention generates a reference current $I_{REF}$ that is substantially constant and has a value that is in the middle between the set current and the reset current of the resistive memory cell, regardless of variations in the resistance of reference cells. More importantly, the distribution of reference current values becomes narrower and sensing margins improve for both logical low and logical high values.

In the above described embodiments, the reference cells includes one reference memory cell for each word line. In other embodiments, a reference cell array may be formed and two or more reference memory cells may be provided for each word line, with all reference memory cells being programmed to the low resistance state.

Also, in the above described embodiments, the bias current source is implemented using a PMOS transistor. The bias current source may be implemented using other circuit elements in other embodiments. The use of a PMOS transistor in FIG. 7 is illustrative only.

Furthermore, in other embodiments, the feedback circuit can be implemented using a voltage multiplier configured to feedback the reference voltage $V_{REF}$ multiplied by a factor to the control terminal of the bias current source.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A resistive memory device, comprising:
   a two-dimensional array of resistive memory cells for storing memory data ("data memory cells"), each resistive memory cell being accessed by a word line, a bit line and a source line, resistive memory cells sharing a common word line forming a row of the array and resistive memory cells sharing a common bit line and a common source line forming a column of the array, the data memory cell providing a cell current indicative of a programmed resistance of the data memory cell in response to being selected for access, the cell current having a first current value associated with a low resistance state and having a second current value associated with a high resistance state;
   a reference current generation circuit for providing a reference current, the reference current generation circuit comprising:
      an array of resistive memory cells programmed to the low resistance state only ("reference memory cells") where the reference memory cell provides a reference cell current having the first current value in response to being selected for access,
      a bias current source controlled by a bias control voltage to generate a bias current having a current value about half of the first current value associated with the low resistance state, and
      a feedback circuit configured to vary the bias current value in response to changes in the reference current to maintain the reference current at a substantially constant value, wherein the reference current generation circuit generates the reference current by combining the reference cell current and the bias current, the reference current having a current value being about half of the first current value associated with the low resistance state; and
   a sense amplifier configured to sense a difference between the reference current and the cell current of a selected data memory cell and to generate an output signal indicative of the current difference, the output signal being indicative of the programmed resistance of the selected data memory cell storing memory data.

2. The resistive memory device of claim 1, wherein each reference memory cell in the array of reference resistive memory cells is accessed by the word line and a reference cell bit line and having a source line connected to a ground potential, and in response to being selected for access, a selected data memory cell provides the cell current indicative of the programmed resistance of the data memory cell to a first node, and a reference memory cell associated with the same word line as the selected data memory cell provides the reference cell current to a second node.

3. The resistive memory device of claim 2, further comprising:
   a first precharge transistor configured to precharge the first node to a first positive voltage potential in response to a precharge control signal; and
   a second precharge transistor configured to precharge the second node to the first positive voltage potential in response to the precharge control signal,
   wherein the first node and the second node are precharged to the first positive voltage potential prior to the data memory cell being selected for access in a read operation.

4. The resistive memory device of claim 2, wherein in response to a reference memory cell being selected for access, the reference cell bit line is connected to the second node and the reference cell current having the first current value related to the low resistance state flows from the second node to the source line of the selected reference memory cell, and wherein the reference current being a difference of the reference cell current and the bias current.

5. The resistive memory device of claim 2, wherein the feedback circuit is configured to measure a reference voltage at the second node indicative of the reference current and to vary the bias control voltage in response to changes in the reference voltage to keep the reference current at a substantially constant value.

6. The resistive memory device of claim 5, wherein:
   the bias current source comprises a transistor having a control terminal coupled to receive the bias control voltage, a first current terminal coupled to a positive power supply voltage and a second current terminal coupled to the second node to provide the bias current; and
   the feedback circuit comprises an operational amplifier having a positive input terminal coupled to the second node to sense a voltage thereof, a negative input terminal, and an output terminal, the feedback circuit further comprising a first resistor and a second resistor connected in series between the output terminal and the ground potential, the negative input terminal being coupled to a common node between the first resistor and the second resistor, thereby forming a feedback loop between the output terminal and the negative input terminal through the first resistor, the output terminal of the operational amplifier providing the bias control voltage.

7. The resistive memory device of claim 4, wherein in response to the reference cell current increasing, the feedback circuit generates the bias control voltage to cause the bias current source to increase the bias current to compensate for the increase in the reference cell current, thereby maintaining the reference current at a substantially constant value.

8. The resistive memory device of claim 4, wherein in response to the reference cell current decreasing, the feedback circuit generates the bias control voltage to cause the bias current source to decrease the bias current to compensate for the decrease in the reference cell current, thereby maintaining the reference current at a substantially constant value.

9. The resistive memory device of claim 5, wherein:
   the bias current source comprises a transistor having a control terminal coupled to receive the bias control voltage, a first current terminal coupled to a positive power supply voltage and a second current terminal coupled to the second node to provide the bias current; and the feedback circuit comprises a voltage multiplier configured to sense a voltage at the second node and to generate the bias control voltage as the sensed voltage multiplied by a factor.

10. A method in a resistive memory device, the resistive memory device including a two-dimensional array of resistive memory cells for storing memory data ("data memory cells"), each memory cell being accessed by a word line, a bit line and a source line, resistive memory cells sharing a common word line forming a row of the array and resistive memory cells sharing a common bit line and a common source line forming a column of the array, the data memory cell providing a cell current indicative of a programmed resistance of the data memory cell in response to being selected for access, the cell current having a first current value associated with a low resistance state and having a second current value associated with a high resistance state, the method comprising:

generating a reference cell current provided by a reference memory cell, the reference cell current having the first current value associated with the low resistance state of the resistive memory cell;

generating a bias current at a bias current source in response to a bias control voltage, the bias current having a current value about half of the first current value associated with the low resistance state;

generating a reference current by combining the reference cell current and the bias current, the reference current having a current value being about half of the first current value associated with the low resistance state;

regulating the bias current bias in response to changes in the reference current to maintain the reference current at a substantially constant;

sensing a difference between the reference current and a cell current of a selected data memory cell; and generating an output signal indicative of the current difference, the output signal being indicative of the programmed resistance of the selected data memory cell storing memory data.

11. The method of claim 10, further comprising:
prior to sensing a difference between the reference current and the cell current, precharging a first node associated with the cell current of the selected data memory cell and precharging a second node associated with the reference current.

12. The method of claim 10, wherein generating a reference current by combining the reference cell current and the bias current comprises:
generating the reference current as a difference of the reference cell current and the bias current.

13. The method of claim 10, wherein regulating the bias current bias in response to changes in the reference current to maintain the reference current comprises:
sensing a reference voltage related to the reference current; and
varying the bias control voltage in response to changes in the reference voltage to keep the reference current at a substantially constant value.

14. The method of claim 10, further comprising:
in response to the reference cell current increasing, varying the bias control voltage to cause the bias current source to increase the bias current to compensate for the increase in the reference cell current, thereby maintaining the reference current at a substantially constant value.

15. The method of claim 10, further comprising:
in response to the reference cell current decreasing, varying the bias control voltage to cause the bias current source to decrease the bias current to compensate for the decrease in the reference cell current, thereby maintaining the reference current at a substantially constant value.

* * * * *